United States Patent

Haratani et al.

[11] Patent Number: 6,144,524
[45] Date of Patent: Nov. 7, 2000

[54] SPIN VALVE MAGNETORESISTANCE DEVICE AND METHOD OF DESIGNING THE SAME

[75] Inventors: Susumu Haratani; Tsutomu Aoyama, both of Chiba; Isamu Sato, Tokyo, all of Japan

[73] Assignee: TDK Corporation, Tokyo, Japan

[21] Appl. No.: 09/287,412

[22] Filed: Apr. 7, 1999

Related U.S. Application Data

[63] Continuation of application No. PCT/JP98/03309, Jul. 24, 1998.

[30] Foreign Application Priority Data

Aug. 7, 1997 [JP] Japan .................................. 9-225783

[51] Int. Cl.$^7$ .................................................. G11B 5/127
[52] U.S. Cl. ................................................................ 360/113
[58] Field of Search .................................. 360/113, 121, 360/125, 126; 324/252

[56] References Cited

U.S. PATENT DOCUMENTS 5,206,590  4/1993  Dieny et al. ............................. 324/252

FOREIGN PATENT DOCUMENTS

| 4-358310 | 12/1992 | Japan . |
| 8-45035 | 2/1996 | Japan . |
| 8-77517 | 3/1996 | Japan . |
| 8-212519 | 8/1996 | Japan . |
| 9-282612 | 10/1997 | Japan . |

OTHER PUBLICATIONS

D. Lu, et al., IEEE Transactions on Magnetics, vol. 31, No. 6, pp. 2615–1617, "Micromagnetic Analysis of Permanent Magnet Biased Narrow Track Spin–Valve Heads", Nov. 1995.

S. Haratani, et al., Journal of the Magnetics Society of Japan, vol. 21, Supplement, No. S2, pp. 371–374, "Micromagnetic Simulation of Hard Bias Field Effects on Submicron Spin Valve Heads", 1997.

*Primary Examiner*—Allen T. Cao
*Attorney, Agent, or Firm*—Oblon, Spivak, McClelland, Maier & Neustadt, P.C.

[57] ABSTRACT

A spin valve magnetoresistance device including a free magnetic layer, a pinned magnetic layer, a non-magnetic layer disposed between them and a permanent magnet film defining a track width $x$(in $\mu$m) and configured to control magnetic domains of the free magnetic layer. The product of the residual magnetization (in $\mu$emu/cm$^3$) of the permanent magnet film times the thickness (in cm) thereof is given by $f(x)$:

$$f(x) = -11.24(1/x^2) + A,$$

where $x \leq 2$ $\mu$m, and $670$ $\mu$emu/cm$^2 \leq A \leq 900$ $\mu$emu/cm$^2$.

21 Claims, 2 Drawing Sheets

SPIN VALVE MAGNETORESISTANCE DEVICE AND METHOD OF DESIGNING THE SAME

This application is a continuation of PCT/JP98/03309, filed Jul. 24, 1998.

BACKGROUND OF THE INVENTION

1. Field of the Invention

The present invention relates to a spin valve magnetoresistance device and a method of designing the same.

2. Description of the Related Art

In recent years, higher sensitivity of magnetic sensors and the higher density in magnetic recording, have been sought. In particular, a magnetoresistance sensor ("MR sensor" hereinafter) and a magnetoresistance head ("MR head" hereinafter) using a mangetoresistance change are being actively developed. The MR sensor and the MR head is for reading an external signal on the basis of a change in the electric resistance of a magnetic field detection portion formed of a magnetic material. In reading data with a conventional inductive head, the output of the head decreases due to a decrease in the relative velocity of the head to a recording medium when the recording medium is downsized. However, the reproduction output of the MR head is not dependent upon its relative velocity to a recording medium, a high output is obtained even in high-density magnetic recording. The sensor portion of a conventional MR head is generally formed of $Ni_{0.81}Fe_{0.19}$ (Permalloy), while the resistance change ratio of Permalloy is approximately 2% at the largest, and it is insufficient in sensitivity as a material for the MR head for reading ultra-high density magnetic record data of several GBPSI order.

In recent years, reports have been published on multi-layered films which exhibit a remarkably higher change ratio in magnetoresistance than a film of an alloy such as Permalloy. These are called an superlattices and have a structure in which thin layers having a thickness of an order of atomic diameter of a metal are periodically laminated. A Fe/Cr superlattice exhibiting a mangetoresistance change of over 40% at an ultra-low temperature (4.2K) has been reported (Phys. Rev. Lett. Vol. 61, page 2,472 (1988)). In the above superlattice, however, the external magnetic field (performance magnetic field intensity) where a maximum resistance change takes place is as large as tens of kilo oersteds, which is not practically usable. Further, a Co/Cu superlattice has also been proposed, but its performance magnetic field intensity is too large.

As a giant magnetoresistance change film which exhibits a large magnetoresistance change ratio, JP-A-4-358310 proposes a multi-layered film called a spin-valve type. A spin vale magnetoresistance device has a free layer which is a magnetic layer, a pinned layer which is a magnetic layer and a non-magnetic layer provided between them, and it is constituted so that antiparallel states of the two magnetic layers in magnetization are induced by an external magnetic field having an intensity between the coercive forces of the magnetic layers and the exchange interaction energy between the free layer and the pinned layer, whereby the device exhibits a large magnetoresistance change.

When many magnetic domains having various magnetization directions (regions having the same magnetization direction) are present in the free layer of the above spin valve magnetoresistance device, and when an external magnetic field is applied, the domains behave so as to align their magnetization directions with the directions of the external magnetic field. However, in this case, a problematic noise, called Barkhausen noise, is coupled with an output waveform.

For preventing the above Barkhausen noise, it is sufficient to keep the free layer so as to have a constant single magnetic domain. For this purpose, there has been already employed a method in which a permanent magnet is provided adjacently to the free layer. Specifically, there is known a configuration in which a spin valve magnetoresistance device having a track width of approximately 2.5 $\mu$m is provided with a permanent magnet film having a thickness of approximately 30 nm and having a residual magnetization of approximately 800 emu/cm$^3$.

It is also desired to further increase the recording density. For that purpose, it is known to narrow the track width. However, as the track width is narrowed, the reproduction output tends to decrease. According to the present inventors' calculation, for example, when the track width is decreased from 1 $\mu$m to 0.3 $\mu$m, the output becomes approximately $\frac{2}{3}$. The reason for the above decrease in the output is assumed as follows. When an external magnetic field is applied to the free layer, the free layer does not entirely undergo magnetization turning, and both ends of the free layer have regions where no magnetization turns, so-called dead zones, due to the magnetic field of the permanent magnet used for controlling magnetic domains. The widths of the dead zones are dependent upon the intensity of the permanent magnet used for controlling magnetic domains but not dependent upon the track width. With a decrease in the track width, therefore, the ratio of the dead zone width to the total width of the entire free layer increases, and the output decreases.

For preventing a decrease in the reproduction output with decreasing the track width, one could decrease the intensity of the permanent magnet (residual magnetization) used for controlling magnetic domains within the limit in which the above Barkhausen noise is not caused.

However, the present inventors' studies have revealed that an inflection point appears in the reproduction output curve of the device or a hysteresis is caused in part of it even within the limit in which the Barkhausen noise is not caused, so that a desirable magnetoresistance change ratio can no longer be obtained.

SUMMARY OF THE INVENTION

It is therefore an object of the present invention to provide a spin valve magnetoresistance device which is naturally free of the Barkhausen noise in a reproduction output, which causes neither the above hysteresis nor the above inflection point in a reproduction output curve and which suffers no decrease in reproduction output caused by narrowing the track.

According to the present inventors' studies, it has been found that abnormalities such as the above hysteresis and inflection point caused in the reproduction output curve are not from the free layer. The hysteresis which takes place in part of the reproduction output curve is a phenomenon that the transition of the reproduction output shows one behavior when an external magnetic field increases and shows another behavior when the external magnetic field decreases. It has been found according to the present inventors' studies that it is because the magnetization turning change which is caused in the pinned layer by the application of an external magnetic field differs between a time when the external magnetic field increases and a time when it decreases that the above hysteresis takes place. It has also been found that the inflection point which takes place in the reproduction output curve when the external magnetic field increases or decreases is caused by the non-uniformity of magnetization turning within the pinned layer. More specifically, it is assumed that when the residual magnetization of the permanent magnet used for controlling magnetic domains becomes lower than a certain critical value, the external magnetic field causes magnetic domains on part of the ABS (air bearing) surface side of the pinned layer, i.e., the side of a surface opposed to a medium, which causes the above abnormalities in the reproduction output curve.

The present invention has been made on the basis of the above findings, and has the following constitutions (1) to (4).

(1) A spin valve magnetoresistance device comprising a free layer which is a magnetic layer, a pinned layer which is a magnetic layer, a non-magnetic layer disposed between them and a permanent magnet film definding a track width y (in $\mu$m) and continued to control magnetic domains of said free layer, a product of the residual magnetization (unit: $\mu$emu/cm$^3$) of said permanent magnet film times the thickness (unit: cm) thereof being represented by the function f(x):

$$f(x) = -11.24\,(1/x^2) + A, \qquad \text{Expression (1)}$$

where x≦2 $\mu$m, and 670 $\mu$emu/cm$^2$ ≦ A ≦ 900 $\mu$emu/cm$^2$.

(2) A spin valve magnetoresistance device according to the above (1), wherein said permanent magnet film has a residual magnetization of 100 to 1,000 emu/cm$^3$ and has a thickness of 5 to 150 nm.

(3) A spin valve magnetoresistance device according to the above (1) or (2), wherein x≦1.

(4) A method of designing a spin valve magnetoresistance device comprising a free layer which is a magnetic layer, a pinned layer which is a magnetic layer, a non-magnetic layer disposed between them and a permanent magnet film definding a track width x (in $\mu$m) and configured to control magnetic domains of said free layer, the method comprising determining the residual magnetization of said permanent magnet film and the thickness thereof so as to have a product of the residual magnetization (unit: $\mu$emu/cm$^3$) of said permanent magnet film times the thickness (unit: cm) thereof is given by $$f(x)\colon f(x) = 11.24(1/x^2) + A, \qquad \text{Expression (1)}$$

where x≦2 $\mu$m, and 670 $\mu$emu/cm$^2$ ≦ A ≦ 900 $\mu$emu/cm$^2$.

DESCRIPTION OF THE PREFERRED EMBODIMENTS

In the present invention, when the track width x is determined, the track width x is substituted in the above expression (1) to determine a product f(x) of the residual magnetization of a permanent magnet for controlling magnetic domains times the thickness thereof. Within the limit of the above f(x), the above residual magnetization and the above thickness are determined. Even if the track width is designed to be narrow, therefore, a sufficiently large reproduction output is obtained. Furthermore, no noise, hysteresis, nor inflection point are caused in the reproduction output curve.

JP-A-8-212519 discloses a magnetoresistance magnetic head structured so as to control magnetic domains of an MR film (magnetoresistance film) and an SAL film (soft magnetic film) with a permanent magnet film, in which the magnetic field from the permanent magnet film is decreased so as to prevent the Barkhausen noise so that to obtain a reproduction output greater than a conventional output. However, unlike the present invention, the magnetoresistance magnetic head disclosed in the above publication is not of any spin valve type. Further, the above publication takes account of the lower limit value of intensity of the magnetic field from the permanent magnet film merely from the viewpoint of prevention of the Barkhausen noise. In contrast, the present invention determines the lower-limit critical point of residual magnetization of the permanent magnet film used for controlling magnetic domains, not only for preventing the Barkhausen noise but also for causing neither a hysteresis nor an inflection point in reproduction output curve, and in this point, the present invention is clearly different from the invention disclosed in the above publication. In the present invention, further, when the track width is once determined, the residual magnetization and thickness of the permanent magnet film can be easily designed so as to be optimized for the track width, while this effect is not at all produced by the technique disclosed in the above publication.

The specific constitution of the present invention will be explained in detail hereinafter.

Figure 1:
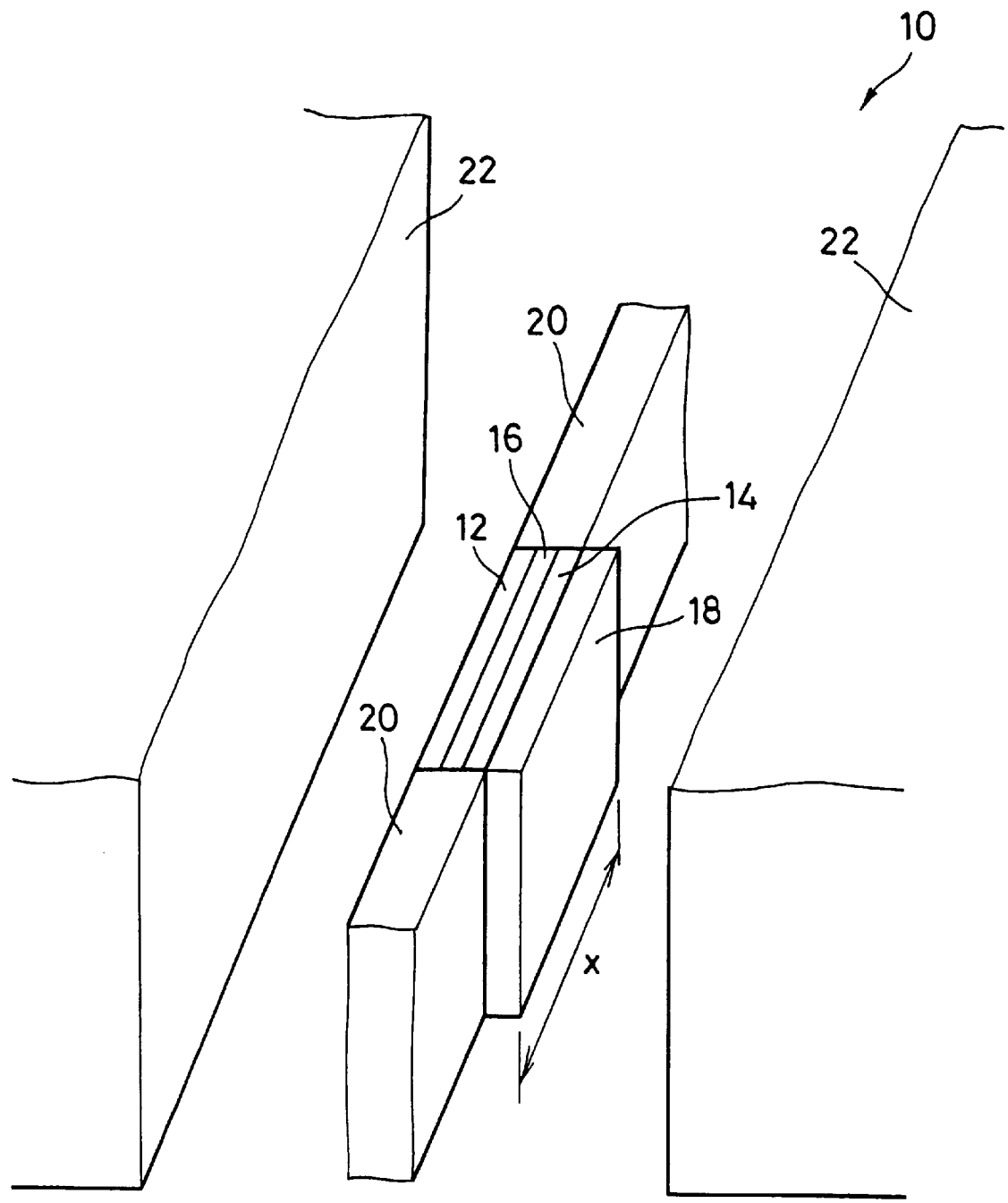
FIG. 1 is a schematic perspective view of one example of the spin valve magnetoresistance device of the present invention.

FIG. 1 shows a schematic perspective view of one example of the spin valve magnetoresistance device having a desired structure, provided by the present invention.

In the Figure, a spin valve magnetoresistance device 10 has a free layer 12 which is a magnetic layer, a pinned layer 14 which is a magnetic layer, a non-magnetic layer 16 disposed between these layers, an anti-ferromagnetic layer 18 which is laminated on the pinned layer 14 and is for fixing the direction of magnetization of the pinned layer 14, a pair of permanent magnet films 20 which are disposed adjacently to the above free layer 12, etc., and are for bringing magnetic domains of the free layer 12 into single magnetic domains, and a pair of shields 22. When an external magnetic field, i.e., a magnetic field from a medium, is applied to the above device, the direction of magnetization of the free layer 12 is turned, which causes a change in an angle formed by the direction of magnetization of the free layer 12 and the direction of magnetization of the pinned layer 14 to cause a change in resistance.

The thickness of each of the magnetic layers constituting the above free layer and the above pinned layer can be approximately 0.8 to 30 nm, particularly 0.8 to 20 nm. The thickness of one layer may be different from the thickness of the other layer. Further, the coercive force of each of these magnetic layers is generally set at approximately 0.01 to 10 Oe. The non-magnetic layer 16 has a thickness of approximately 1 to 6 nm, particularly approximately 1 to 4 nm, and the total thickness of the above free layer 12, pinned layer 14 and nonmagnetic layer 16 is preferably approximately 9 to 60 nm.

As a material for the free layer 12, the free layer 12 is preferably constituted, for example, of NiFe or a two-layer structure of NiFe/Co, NiFe/CoFe, NiFeX/Co, NiFeX/CoFe, NiFe/CoY or NiFe/CoFeY. As a material for the pinned layer 14, the pinned layer 14 is preferably constituted of NiFe, Co, CoFe, CoFeY or a two-layer structure of Co/NiFe or CoFe/NiFe. When a two-layer structure is employed, Co or CoFe is provided on the non-magnetic layer side. In the above compositions, each of X and Y is an additive element, and it is at least one of Pd, Al, Cu, Ta, In, B, Nb, Hf, Mo, W, Re, Ru, Rh, Ga, Zr, Ir, Au and Ag.

The non-magnetic layer 16 is a material which serves to decrease the magnetic interaction between the free layer and the pinned layer. For decreasing the resistance of the device, it is preferred to constitute the non-magnetic layer of a metal non-magnetic material having a high conductivity. The exchange interaction energy between the free layer and the pinned layer is preferably approximately 0.001 to 100 erg/cm$^2$. The metal non-magnetic material is preferably selected from Au, Ag, Cu and alloys of these.

The anti-ferromagnetic layer 18 is preferably set so as to have a thickness of approximately 5 to 30 nm. The material for the anti-ferromagnetic layer 18 includes, for example, FeMn, NiMn, XMn (X=Pt, Pd, Ir, Ru or Rd), alloys of these and alloys to which a trace element is incorporated.

Specific examples of the layer structure and the resistance change ratio thereof are shown below. Parenthesized values show thicknesses (unit: nm).

| No. | Layer structure | Resistance change ratio |
| --- | --- | --- |
|  | Anti-ferromagnetic layer/pinned layer/non-magnetic layer/free layer |  |
| 1 | [FeMn(10)/NiFe(3)/Cu(3)/NiFe(3)] | 2.8% |
| 2 | [CoPt(8)/NiFe(3)/Cu(3)/NiFe(4)] | 2.3% |
| 3 | [FeMn(5.5)/CoFe(2)/Cu(3)/NiFe(6)] | 5% |
| 4 | [FeMn(10)/Co(2)/Cu(2.5)/NiFe(10)] | 4% |

For fixing the direction of magnetization of the pinned layer 14, a permanent magnet layer may be provided in place of the anti-ferromagnetic layer. The layer structure of the above No. 2 is an example in which a permanent magnet layer formed of CoPt is provided in place of the anti-ferromagnetic layer.

In the present invention, when the track width is x (unit: μm), the range of the product of the residual magnetization (unit: μemu/cm$^3$) of the permanent magnet film 20 and the thickness (unit:cm) thereof in the above spin valve magnetoresistance device is limited on the basis of the function f(x) of the following expression (1).

$$f(x) = -11.24 \ (1/x^2) + A, \qquad \text{Expression (1)}$$

In the above expression, x≤μm, and 670 μemu/cm$^2$≤A≤900 μemu/cm$^2$, preferably, x≤1 μm.

When the product of the residual magnetization of the permanent magnet film and the film thickness, i.e., the intensity of a magnetic field to be actually applied to the free layer with the permanent magnet film is within the range represented by the above expression (1), a sufficient output is obtained even if the track width is narrow, and that there are obtained desired output characteristics free of a hysteresis and an inflection point.

The above expression (1) has been determined as follows.

First, the track width, and the residual magnetization of the permanent magnet for controlling magnetic domains and the thickness thereof were taken as parameters, and outputs of the device were determined by micromagnetic simulation of magnetic domain analysis simulation. In the simulation, the track width x was set at 1.0 μm, 0.6 μm, 0.4 μm and 0.3 μm. Further, the magnetization distribution of the free layer and the pinned layer was determined on the basis of Landau-Lifshitz-Gilbert (LLG) gyromagnetic equation.

Figure 2:
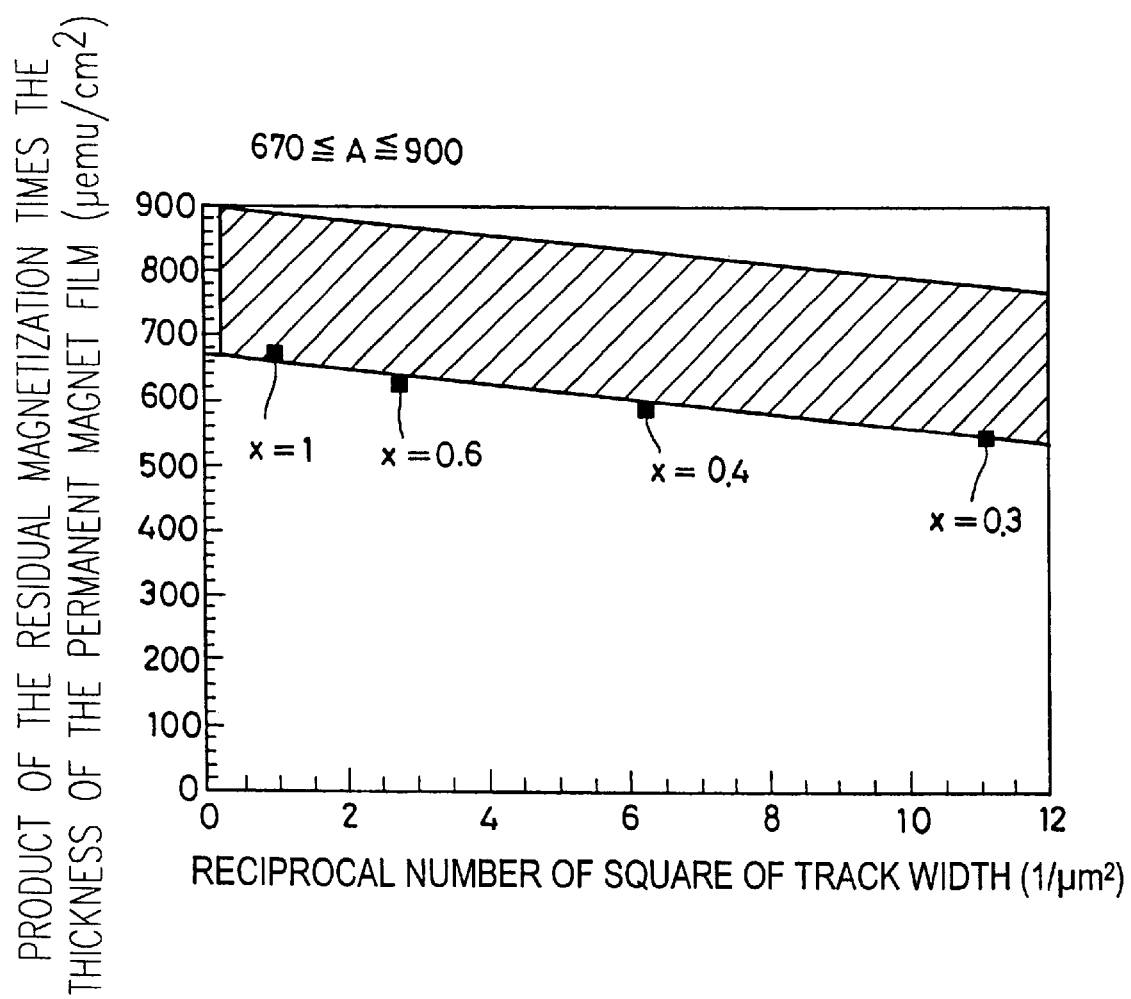
FIG. 2 is a graph showing a region which should be satisfied by a reciprocal number of square of a track width and a product of the residual magnetization times the thickness of a permanent magnet film, for obtaining a spin valve magnetoresistance device which gives a sufficient output and causes no abnormality in output curve.

In the above simulation, there were determined critical minimum values of the residual magnetization times the film thickness product in which no abnormality caused presumably by the unstableness of the pinned layer took place in output curve. And, when the above critical minimum values were plotted in a graph of which the axis of abscissas indicates reciprocal values of squares of track widths and the axis of ordinates indicates the residual magnetization times the film thickness products of permanent magnet films for controlling magnetic domains, plotted points are arranged nearly linearly as shown in FIG. 2. Therefore, the reciprocal value of square of a track width x (1/x$^2$) and the residual magnetization times the film thickness product f(x) were assumed to have a proportional relationship, an regression line connecting the plotted points in FIG. 2 was determined by the method of least squares, and a coefficient of 1/x$^2$ and the lower-limit value of the variable A in the above expression (1) were determined. Further, it has been confirmed that when the track width x is 1 μm, a practically sufficient output can be obtained so long as A≤900, and further, it has been confirmed that when x is 0.3 μm, at least 75% of the output when x is 1 μM can be obtained so long as A≤900. The upper limit value of the variable A has been therefore determined to be 900.

In FIG. 2, a hatched region covers the range of f(x) of the above expression (1).

In the present invention, it is because the influence of the permanent magnet film for controlling magnetic domains on an output is relatively small in a wide-track device that the track width x is limited to 2 μm or less, preferably 1 μm or less. Namely, that is because a sufficient output can be obtained even if a magnetic field for controlling magnetic domains, which is sufficiently large for preventing the occurrence of abnormalities in a reproduction output curve, is applied to the free layer. When the track width is too small, it comes to be difficult to decrease the influence of the dead zone derived from the magnetic field of the permanent magnet film for controlling magnetic domains. The track width x is therefore preferably limited to 0.05 μm or more.

The thickness of the permanent magnet film is not specially limited so long as the above expression (1) is satisfied. Actually, however, it is preferably 5 to 150 nm, particularly preferably 10 to 100 nm. When the thickness of the permanent magnet film is too small, it is difficult to obtain a sufficient coercive force and it is sometimes difficult to effectively control the magnetic domains. When the thickness of the permanent magnet film is too large, it is required to decrease the residual magnetization appreciably, which results in a difficulty in controlling the magnetic domains.

Further, the residual magnetization of the permanent magnet film is not specially limited, either, so long as the above expression (1) is satisfied. Actually, however, it is preferably approximately 100 to 1,000 emu/cm$^3$. In combination of the above range with the above thickness range, full controlling of the magnetic domains and a sufficient device output can be easily materialized.

The material for forming the permanent magnet film is not specially limited, and it can be selected, for example, from CoPt, CoPtCr, CoPtTaCr, SmCo, or the like.

Each layer can be formed by any one of thin film forming methods such as a molecular beam epitaxy (NBE), a sputtering method, a vapor deposition method, etc.

The shield 22 can be formed of any one of various soft magnetic materials such as Permalloy, sendust, Co-containing amorphous alloys (CoZrNb, CoZrMo, etc.), FeZrN, FeTaN and compositions prepared by incorporating a trace element thereto. The thickness of the shield 22 can be approximately 1 to 4 μm.

EXAMPLES

The present invention will be explained more in detail with reference to specific examples of the present invention hereinafter.

The value of variable A was set at 700, the track width x was set at 0.3 μm or 1 μm, and the product f(x) of the residual magnetization of the permanent magnet film and the thickness thereof was determined by substituting the above values in the above expression (1), to obtain f(x)=688.76 (x=1) or f(x)=575.11 (x=0.3). And, there was selected a permanent magnet material which was formed of CoPt and had a residual magnetization of 750 emu/cm$^3$, and the necessary thickness of the permanent magnet film was determined by dividing the above values of f(x) by the above residual magnetization value, to obtain 9.1 nm (x=1) or 7.7 nm (x=0.3).

Then, spin valve magnetoresistance devices having combinations of the track widths and the permanent magnet film thicknesses determined by the above calculations were prepared. In each device, the MR film formed of an antiferromagnetic layer/pinned layer/non-magnetic layer/free layer was arranged to have a layer structure of FeMn(5.5)/FeCo(2)/Cu(3)/NiFe(6) [values showed thicknesses (unit: nm)], and a permanent magnet film of the above permanent magnet material was formed adjacently to the MR film. Wiring, etc., were applied to these devices according to a conventional method, and then, the devices were measured for reproduction outputs with a spin stand (head tester). The measurement used a magnetic disc (number of turning 7,200 rpm) having 10 kFCI signals stored in an optimum recording current.

Further, a device was prepared in the same manner as in the preparation of the above devices except that the track width was changed to 1 μm and that the variable A was set at 900, and the device was measured for a reproduction output as well.

As a result, the device in which the track width was 0.3 μm and A=700 gave a reproduction output equivalent to the output of the device in which the track width was 1 μm and A=900. Further, the output of the device in which the track width was 1 μm and A=700 was 113% of the output of the device in which the track width was the same and A=900. In reproduction output curves of these devices, further, there was not found any abnormality such as the occurrence of hysteresis in some part or the occurrence of an inflection point.

Further, devices in which the track width was 0.3 μm and A was 670, 800 and 900 were prepared, and these devices were measured for reproduction outputs. The outputs of these were 103%, 88% and 77% of the output of the device in which the track width was the same and A=700. No abnormality was found in the reproduction output curves of these devices.

For comparison, the variable A in the above expression (1) was taken as 650 and 950 outside the scope of the present invention, and values of f(x) were determined by substituting x=0.3 in the above expression (1), to obtain 525.11 (A=650) and 825.11 (A=950). Necessary thicknesses of permanent magnet films were determined by dividing the above values of f(x) by the above residual magnetization of 750 emu/cm$^3$, to obtain 7 nm (A=650) and 11 nm (A=950). Then, devices were prepared in the same manner as in the above-described procedures except that the thickness of the permanent magnet film was changed to 7 nm or 11 nm, and the devices were measured in the same manner as described above. As a result, the device in which A=650 actually showed a hysteresis and an inflection point in the output curve thereof, and failed to maintain the linearity of the output. Further, the device in which A=950 showed an output which was decreased to about ⅗ of that when A=700, and no sufficient output was obtained.

The above Examples have endorsed the effect of the present invention.

INDUSTRIAL UTILITY

Even if the track width is narrowed, the spin valve magnetoresistance device of the present invention can give a large output and desirable output characteristics free of a hysteresis and an inflection point, so that it is suitable for use, for example, in a reproduction head for high-density magnetic recording media.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A spin valve magnetoresistance device comprising:
  a free magnetic layer;
  a pinned magnetic layer;
  a non-magnetic layer disposed between said free magnetic layer and said pinned magnetic layer; and
  a permanent magnet film defining a non-zero track width x (in μm) configured to control magnetic domains of said free magnetic layer;
  wherein a product of a residual magnetization (in μemu/cm$^3$) of said permanent magnet film times a thickness (in cm) of said permanent magnet film is given by f(x):

$$f(x)=-11.24(1/x^2)+A,$$

where x≦2 μm, and 670 μemu/cm$^2$≦A≦900 μemu/cm$^2$.

2. The spin valve magnetoresistance device of claim 1, wherein said permanent magnet film has a residual magnetization of 100 to 1,000 emu/cm$^3$ and has a thickness of 5 to 150 nm.

3. The spin valve magnetoresistance device of claim 1 or 2, wherein x≦1 μm.

4. The spin valve magnetoresistance device of claim 1, further comprising a pair of permanent magnet films disposed adjacently to the free magnetic layer.

5. The spin valve magnetoresistance device of claim 1, further comprising a pair of magnetic shields configured to shield the free magnetic layer from external magnetic fields.

6. The spin valve magnetoresistance device of claim 1, wherein the free magnetic layer comprises a material selected from the group consisting of NiFe, NiFe/Co, NiFe/CoFe, NiFeX/Co, NiFeX/CoFe, NiFe/CoY and NiFe/CoFeY, wherein X and Y are elements selected from the group consisting of Pd, Al, Cu, Ta, In, B, Nb, Hf, Mo, W, Re, Ru, Rh, Ga, Zr, Ir, Au and Ag.

7. The spin valve magnetoresistance device of claim 1, wherein the pinned magnetic layer comprises a material selected from the group consisting of NiFe, Co, CoFe, CoFeY, Co/NiFe and CoFe/NiFe, wherein Y is Pd, Al, Cu, Ta, In, B, Nb, HF, Mo, W, Re, Ru, Rh, Ga, Zr, Ir, Au or Ag.

8. The spin valve magnetoresistance device of claim 1, wherein the non-magnetic layer comprises a material selected from the group consisting of Au, Ag and Cu.

9. The spin valve magnetoresistance device of claim 1, wherein the permanent magnet film comprises a material selected from the group consisting of CoPt, CoPtCr, CoPtTaCr and SmCo.

10. The spin valve magnetoresistance device of claim 1, further comprising one of an anti-ferromagnetic layer and a permanent magnetic layer, said anti-ferromagnetic layer and permanent magnetic layer being configured to fix a direction of magnetization of the pinned layer.

11. A method of designing a spin valve magnetoresistance device comprising a free magnetic layer, a pinned magnetic layer, a non-magnetic layer disposed between the free magnetic layer and the pinned magnetic layer and a permanent magnet film defining a non-zero track width x (in $\mu$m) and configured to control magnetic domains of said free magnetic layer, the method comprising:

determining a residual magnetization of said permanent magnet film; and determining a thickness of said permanent magnet film;

wherein a product of said residual magnetization (in $\mu$emu/cm$^3$) times said thickness (in cm) is given by f(x):

$$f(x) = -11.24(1/x^2) + A,$$

where $x \leq 2$ $\mu$m, and 670 $\mu$emu/cm$^2 \leq A \leq 900$ $\mu$emu/cm$^2$.

12. A spin valve magnetoresistance device comprising:
a free magnetic layer;
a pinned magnetic layer;
a non-magnetic layer disposed between said free magnetic layer and said pinned magnetic layer; and
a permanent magnet film defining a track width x (in $\mu$m) configured to control magnetic domains of said free magnetic layer;
wherein a product of a residual magnetization (in $\mu$emu/cm$^3$) of said permanent magnet film times a thickness (in cm) of said permanent magnet film is given by f(x):

$$f(x) = -11.24(1/x^2) + A,$$

where 0.05 $\mu$m $\leq x \leq 2$ $\mu$m, and 670 $\mu$emu/cm$^2 \leq A \leq 900$ $\mu$emu/cm$^2$.

13. The spin valve magnetoresistance device of claim 12, wherein said permanent magnet film has a residual magnetization of 100 to 1,000 emu/cm$^3$ and has a thickness of 5 to 150 nm.

14. The spin valve magnetoresistance device of claim 12 or 13, wherein $x \leq 1$ $\mu$m.

15. The spin valve magnetoresistance device of claim 12, further comprising a pair of permanent magnet films disposed adjacently to the free magnetic layer.

16. The spin valve magnetoresistance device of claim 12, further comprising a pair of magnetic shields configured to shield the free magnetic layer from external magnetic fields.

17. The spin valve magnetoresistance device of claim 12, wherein the free magnetic layer comprises a material selected from the group consisting of NiFe, NiFe/Co, NiFe/CoFe, NiFeX/Co, NiFeX/CoFe, NiFe/CoY and NiFe/CoFeY, wherein X and Y are elements selected from the group consisting of Pd, Al, Cu, Ta, In, B, Nb, Hf, Mo, W, Re, Ru, Rh, Ga, Zr, Ir, Au and Ag.

18. The spin valve magnetoresistance device of claim 12, wherein the pinned magnetic layer comprises a material selected from the group consisting of NiFe, Co, CoFe, CoFeY, Co/NiFe and CoFe/NiFe, wherein Y is Pd, Al, Cu, Ta, In, B, Nb, HF, Mo, W, Re, Ru, Rh, Ga, Zr, Ir, Au or Ag.

19. The spin valve magnetoresistance device of claim 12, wherein the non-magnetic layer comprises a material selected from the group consisting of Au, Ag and Cu.

20. The spin valve magnetoresistance device of claim 13, wherein the permanent magnet film comprises a material selected from the group consisting of CoPt, CoPtCr, CoPtTaCr and SmCo.

21. A method of designing a spin valve magnetoresistance device comprising a free magnetic layer, a pinned magnetic layer, a non-magnetic layer disposed between the free magnetic layer and the pinned magnetic layer and a permanent magnet film defining a track width x (in $\mu$m) and configured to control magnetic domains of said free magnetic layer, the method comprising:

determining a residual magnetization of said permanent magnet film; and determining a thickness of said permanent magnet film;

wherein a product of said residual magnetization (in $\mu$emu/cm$^3$) times said thickness (in cm) is given by f(x):

$$f(x) = -11.24(1/x^2) + A,$$

where 0.05 $\mu$m $\leq x \leq 2$ $\mu$m, and 670 $\mu$emu/cm$^2 \leq A \leq 900$ $\mu$emu/cm$^2$.

* * * * *

UNITED STATES PATENT AND TRADEMARK OFFICE
CERTIFICATE OF CORRECTION

PATENT NO. : 6,144,524
DATED : November 7, 2000
INVENTOR(S) : Susumu Haratani et al.

It is certified that error appears in the above-identified patent and that said Letters Patent is hereby corrected as shown below:

Claim 20,
Line 1, change "13" to -- 12 --.

Signed and Sealed this

Eleventh Day of December, 2001

Attest:

NICHOLAS P. GODICI
Attesting Officer    Acting Director of the United States Patent and Trademark Office